United States Patent
Jain (10) Patent No.: US 8,476,948 B2
(45) Date of Patent: Jul. 2, 2013

(54) REDUCED AREA SCHMITT TRIGGER CIRCUIT

(75) Inventor: Rajeev Jain, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 286 days.

(21) Appl. No.: 12/614,047

(22) Filed: Nov. 6, 2009

(65) Prior Publication Data

US 2011/0043265 A1    Feb. 24, 2011

(30) Foreign Application Priority Data

Aug. 21, 2009   (IN) .............................. 1739/Del/2009

(51) Int. Cl.
*H03K 3/00*   (2006.01)
(52) U.S. Cl.
USPC .......................... 327/205; 327/206; 327/112
(58) Field of Classification Search
USPC .... 327/205, 206, 112, 170, 389, 391; 326/26, 326/27, 83
See application file for complete search history.

(56) References Cited

U.S. PATENT DOCUMENTS

| | | | |
|---|---|---|---|
| 3,984,704 A | 10/1976 | Jorgensen | |
| 6,008,679 A * | 12/1999 | Masuda | 327/205 |
| 6,624,672 B2 * | 9/2003 | Confaloneri et al. | 327/112 |
| 7,167,036 B2 * | 1/2007 | Fournel | 327/333 |
| 7,282,961 B1 * | 10/2007 | Daudelin et al. | 326/121 |

OTHER PUBLICATIONS

Kim, K., et al, "Ultra-low voltage high-speed Schmitt trigger circuit in SOI MOSFET technology," IEICE Electronic Express; vol. 4, No. 19;Oct. 10, 2007; pp. 606-611.

* cited by examiner

*Primary Examiner* — Long Nguyen
(74) *Attorney, Agent, or Firm* — Hogan Lovells US LLP (57) ABSTRACT

A Schmitt trigger circuit includes a first inverter having an input coupled to an input terminal; a second inverter having an input coupled to the input terminal; a first transistor having a source coupled to VDD, a drain coupled to an output of the first inverter, and a gate coupled to an output terminal; a second transistor having a source coupled to ground, a drain coupled to an output of the second inverter, and a gate coupled to the output terminal; a third transistor having a source coupled to VDD, a drain coupled to the output terminal, and a gate coupled to the output of the first inverter; and a fourth transistor having a source coupled to ground, a drain coupled to the output terminal, and a gate coupled to the output of the second inverter.

15 Claims, 8 Drawing Sheets

REDUCED AREA SCHMITT TRIGGER CIRCUIT

RELATED APPLICATION

The present application claims priority of India Provisional Patent Application No. 1739/Del/2009 filed Aug. 21, 2009, which is incorporated herein in its entirety by this reference.

FIELD OF THE INVENTION

The present invention relates to Schmitt trigger circuits.

BACKGROUND OF THE INVENTION

Figure 1:
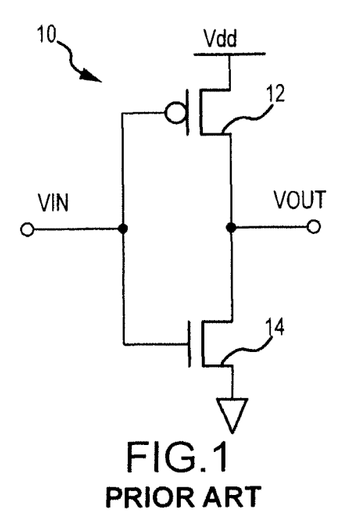
FIG. 1 is a schematic diagram of a basic prior art inverter.

Referring now to FIG. 1, a typical prior art inverter circuit 10 includes a P-channel transistor 12 having a gate coupled to the VIN input, a source coupled to VDD, and a drain coupled to the VOUT output. Inverter 10 also includes an N-channel transistor 14 having a gate coupled to the VIN input, a source coupled to ground, and a drain coupled to the VOUT output.

Figure 2:
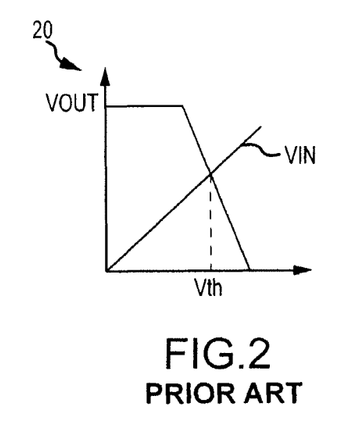
FIG. 2 is a plot of VOUT vs. VIN for the inverter of FIG. 1.
Figure 3:
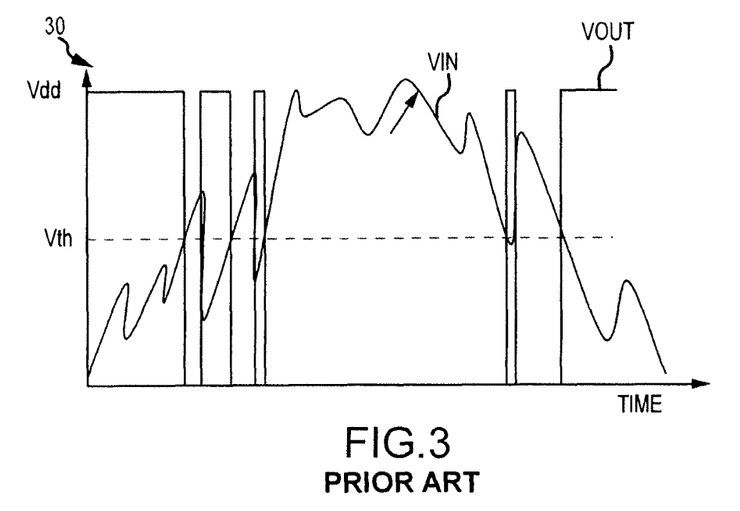
FIG. 3 is a timing diagram of VOUT vs a noisy VIN pulse for the inverter of FIG. 1.

The problem with inverter 10 is that, because there is no hysteresis, it is sensitive to input noise centered around threshold voltage Vth. Referring to FIG. 2, the input vs. output characteristics 20 are shown wherein the VOUT voltage switches as the VIN voltage increases past the Vth threshold voltage. Referring to the timing diagram 30 of FIG. 3, a noisy VIN voltage pulse results in a VOUT voltage that unacceptably switches frequently at the rising and trailing edge of the input pulse.

As is known in the art, Schmitt trigger circuits having hysteresis can significantly improve the switching characteristics of the basic inverter shown in FIG. 1. Prior art Schmitt trigger circuits are shown in FIGS. 4, 6, and 7.

Figure 4:
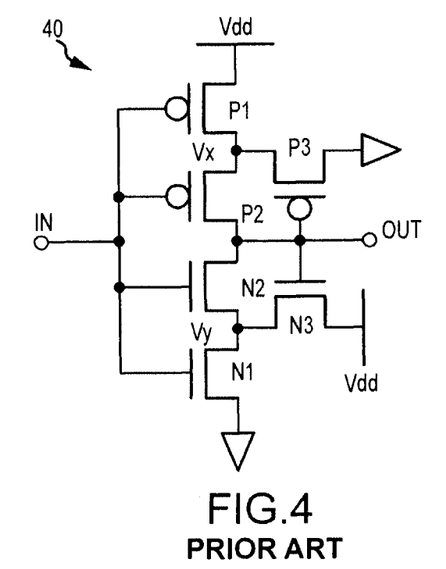
FIG. 4 is a schematic diagram of a first Schmitt trigger circuit according to the prior art.

Referring now to FIG. 4, a first prior art Schmitt trigger circuit 40 includes a plurality of P-channel and N-channel transistors. A first P-channel transistor P1 has a gate coupled to the IN input node, a source coupled to VDD, and a drain coupled to the Vx node. A second P-channel transistor P2 has a gate coupled to the IN input node, a source coupled to the Vx node, and a drain coupled to the OUT output node. A third P-channel transistor has a gate coupled to the OUT output node, and a current path coupled between the Vx node and ground. A first N-channel transistor has a gate coupled to the IN input node, a source coupled to ground, and a drain coupled to the Vy node. A second N-channel transistor has a gate coupled to the IN input node, a source coupled to the Vy node, and a drain coupled to the OUT output node. A third N-channel transistor has a gate coupled to the OUT output node, and a current path coupled between the Vy node and VDD.

Figure 5:
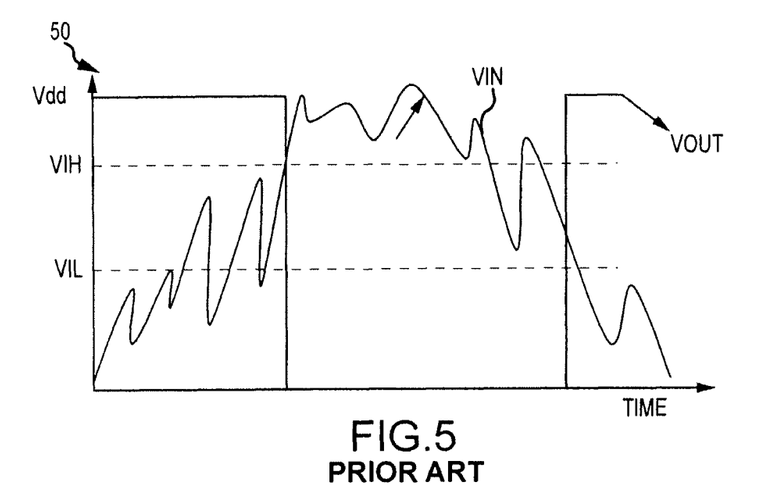
FIG. 5 is a timing diagram of VOUT vs a noisy VIN pulse for the Schmitt trigger circuit of FIG. 4.

Referring now to FIG. 5, the timing diagram 50 reveals that the output voltage VOUT switches cleanly in response to the noisy VIN input pulse, and the switching problems with the prior art inverter shown in FIG. 1 are solved. However, the circuit 40 shown in FIG. 4 cannot operate at low supply voltages, cannot operate at high speeds, and the hysteresis critically depends on the supply voltage.

Figure 6:
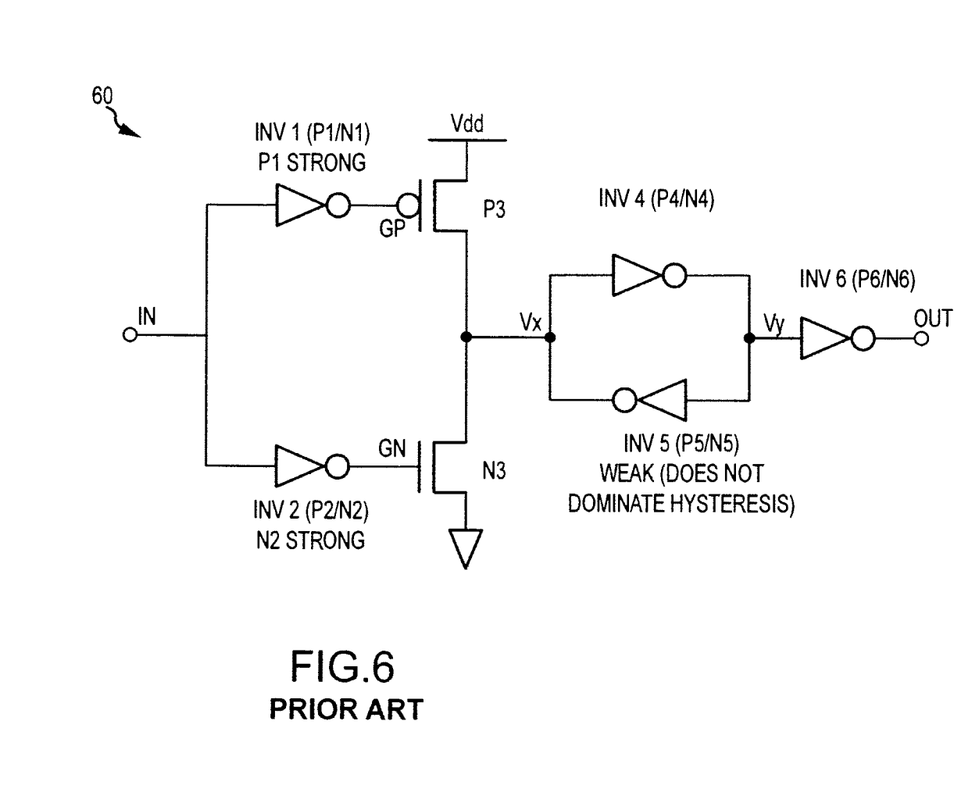
FIG. 6 is a schematic diagram of a second Schmitt trigger circuit according to the prior art.
Figure 7:
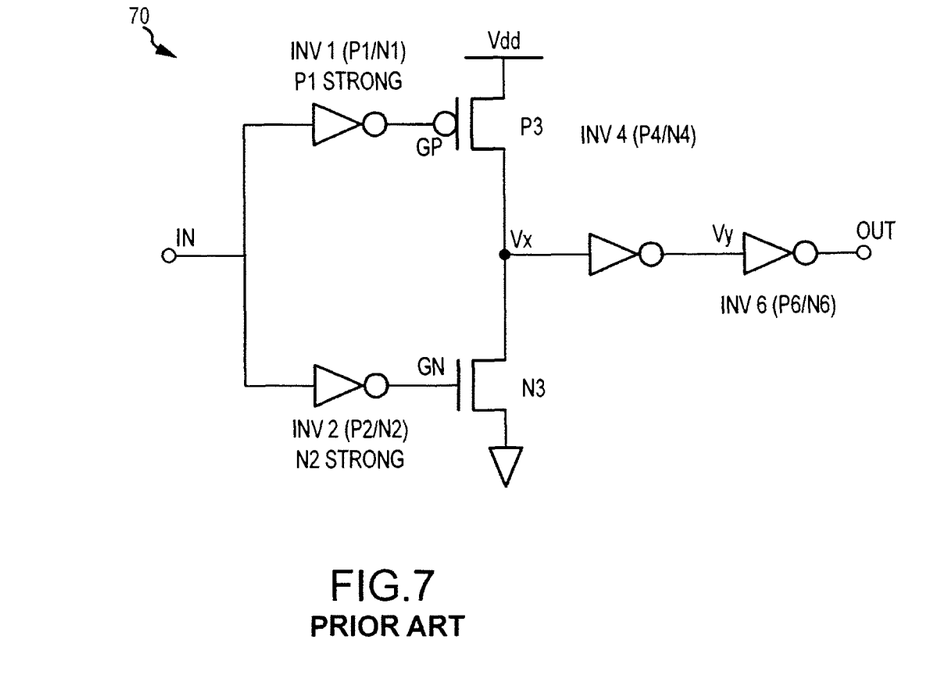
FIG. 7 is a schematic diagram of a third Schmitt trigger circuit according to the prior art.

Referring now to FIG. 6, a second prior art Schmitt trigger circuit 60 includes a first inverter having an input coupled to the IN input voltage, and a second inverter having an input coupled to the IN input voltage. The gate of a first P-channel transistor is coupled to the output of the first inverter at the GP node. The current path of the first P-channel transistor is coupled between VDD and the Vx node. The gate of a first N-channel transistor is coupled to the output of the second inverter at the GN node. The current path of the first N-channel transistor is coupled between the Vx node and ground. An output diode circuit including three inverters INV4, INV5, and INV6 is coupled between the Vx node and the OUT output node.

In circuit 60 the threshold voltages of the first and second inverters (INV1 and INV2) decides the circuit hysteresis, which is highly PVT" (i.e., process/supply voltage/temperature variation) sensitive. There are higher delays with Schmitt trigger circuit 60 because nodes GP and GN can become very capacitive. In addition, circuit 60 has a large area that is unsuitable for integration.

A third prior art Schmitt trigger circuit 70 is shown in FIG. 7 and is very similar to the one shown in FIG. 6. However, the inverter circuit coupled to node Vx includes only two serially connected inverters: INV4 coupled to INV6 at the Vy node. The inverter latch in FIG. 6 is removed. This allows circuit 70 to go to a floating state before any transition occurs. In turn, this results in a reduced delay as compared to prior art circuit 60, but also results in a severely reduced hysteresis.

What is desired, therefore, is a Schmitt trigger circuit that overcomes the limitations of the prior art, while having an effective hysteresis function and is suitable for integration by having a minimum die area.

SUMMARY OF THE INVENTION

According to the present invention, a Schmitt trigger circuit includes a first inverter having an input coupled to an input terminal; a second inverter having an input coupled to the input terminal; a first transistor having a source coupled to VDD, a drain coupled to an output of the first inverter, and a gate coupled to an output terminal; a second transistor having a source coupled to ground, a drain coupled to an output of the second inverter, and a gate coupled to the output terminal; a third transistor having a source coupled to VDD, a drain coupled to the output terminal, and a gate coupled to the output of the first inverter; and a fourth transistor having a source coupled to ground, a drain coupled to the output terminal, and a gate coupled to the output of the second inverter.

BRIEF DESCRIPTION OF THE DRAWINGS

The invention will be better understood by reference to the following description taken in conjunction with the accompanying drawings, wherein.

DETAILED DESCRIPTION OF PREFERRED EMBODIMENTS

Figure 8:
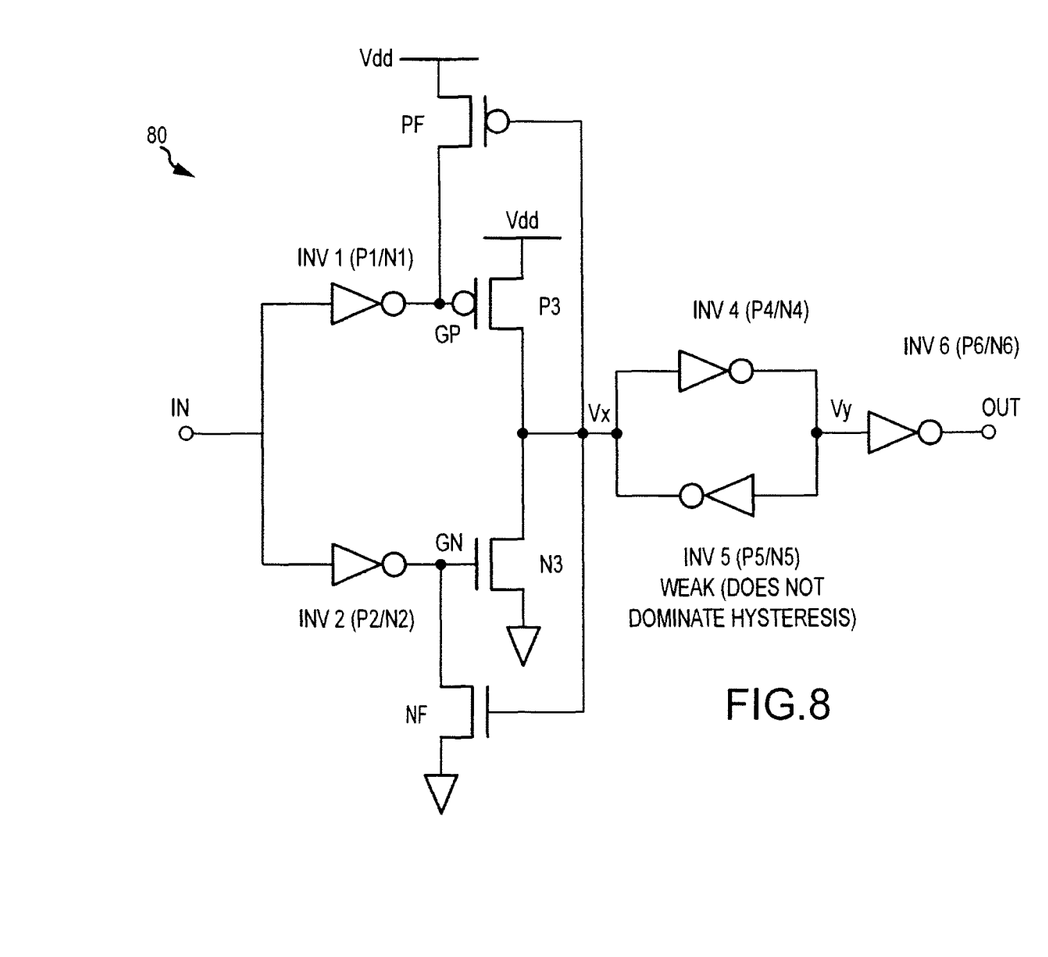
FIG. 8 is a schematic diagram of a Schmitt trigger circuit according to the present invention.

Referring now to FIG. 8, a Schmitt trigger circuit according to an embodiment of the present invention includes comprising a first inverter INV1 having an input coupled to an input terminal IN; a second inverter INV 2 having an input coupled to the input terminal IN; a first transistor PF having a source coupled to VDD, a drain coupled to an output of the first inverter INV1, and a gate coupled to an output terminal OUT through an inverter circuit; a second transistor NF having a source coupled to ground, a drain coupled to an output of the second inverter INV2, and a gate coupled to the output terminal OUT through the inverter circuit; a third transistor P3 having a source coupled to VDD, a drain coupled to the output terminal OUT through the inverter circuit, and a gate coupled to the output of the first inverter INV1; and a fourth transistor N3 having a source coupled to ground, a drain coupled to the output terminal OUT through the inverter circuit, and a gate coupled to the output of the second inverter INV2. The inverter circuit has an input coupled to the Vx node, and an output coupled to the OUT node. The inverter circuit includes a latch, which comprises inverter INV4 coupled to inverter INV5. The latch circuit is coupled to inverter INV6, the output of which is coupled to the OUT node. In FIG. 8, inverter INV1 can include a P-channel transistor P1 and an N-channel transistor N1. Inverter INV2 can include a P-channel transistor P2 and an N-channel transistor N2. Transistors PF and P3 are P-channel transistors. Transistors NF and N3 are N-channel transistors. Inverter INV4 can include a P-channel transistor P4 and an N-channel transistor N4. Inverter INV5 can include a P-channel transistor P5 and an N-channel transistor N5. Transistors P5 and N5 are sized to be small so that INV5 does not dominate the hysteresis of the rest of circuit 80.

In the circuit 80 of FIG. 8, only two MOS transistors PF and NF are added, which provide feedback from the Vx node. Inverters INV1 and INV2 are identical and minimum size, which results in a desirable area reduction. The hysteresis of circuit 80 is less sensitive to power supply variations.

Figure 9:
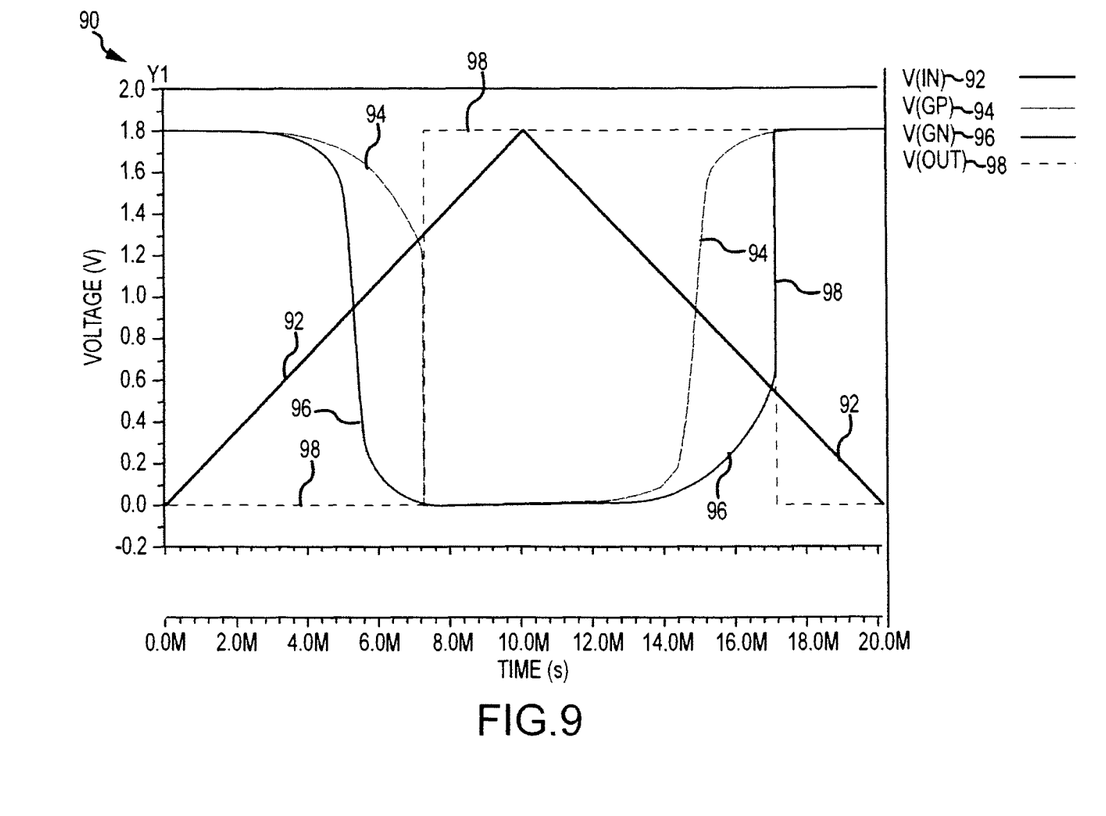
FIGS. 9-13 are plots and timing diagrams comparing the performance of the Schmitt trigger circuit of the present invention to prior art Schmitt trigger circuits.

Referring now to the timing diagram 90 (common voltage axis vs time) of FIG. 9, voltage waveforms at various nodes of circuit 80 are shown in response to a ramp input voltage. In FIG. 9, the following node voltage waveforms are shown:

V(IN)—92
V(GP)—94
V(GN)—96
V(OUT)—98

Figure 10:
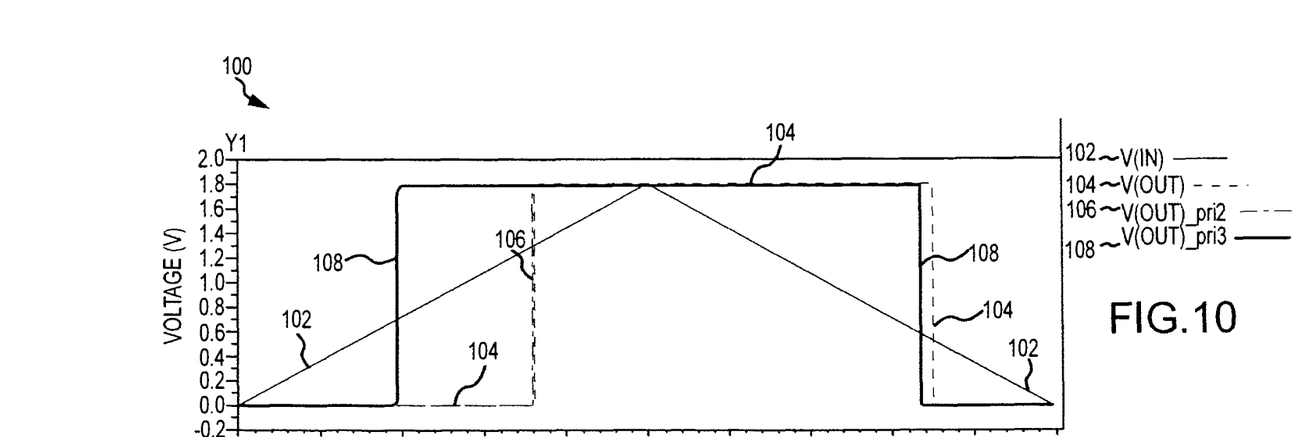
Figure 11:
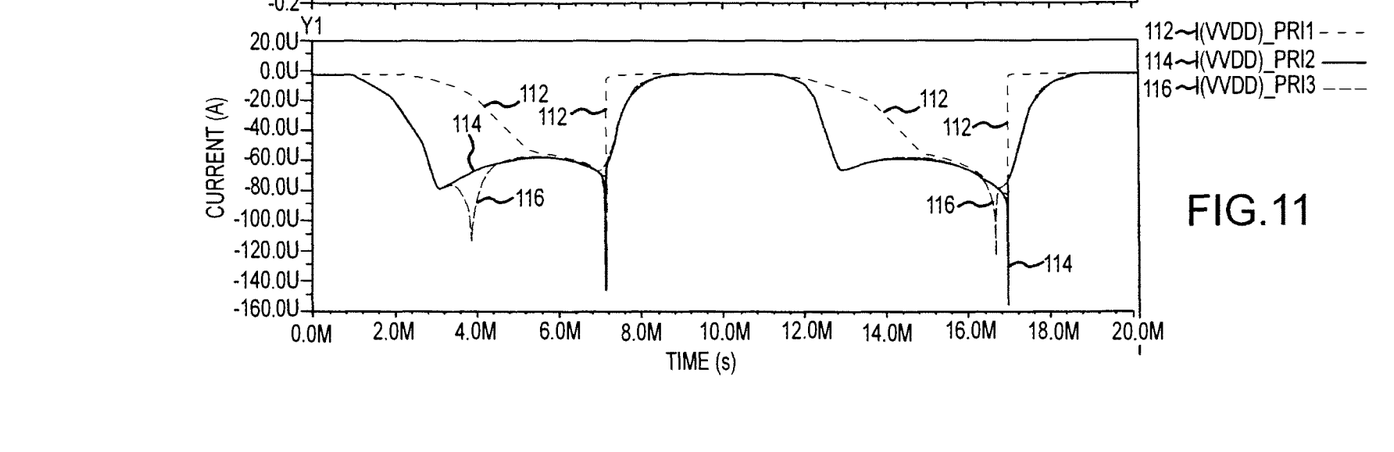

Referring now to the timing diagrams 100 and 110 of FIGS. 10 and 11, a comparative output response of the present invention and the prior art circuits is shown for a ramp input voltage. Circuit 80 according to the present invention has a wider hysteresis width and less average current consumption than the prior art circuits.

In FIG. 10, the following node voltage waveforms are shown:

V(IN)—102
V(OUT) of circuit 80—104
V(OUT) second prior art circuit—106
V(OUT) third prior art circuit—108

In FIG. 11, the following node voltage waveforms are shown:

I(VDD) of circuit 80—112
I(VDD) of second prior art circuit—114
I(VDD) of third prior art circuit—116

Some of the advantages of circuit 80, according to the present invention is that it has less delay than the second prior art circuit, improved hysteresis performance over the third prior art circuit, and has up to 82.6% area saving. In addition, the hysteresis of circuit 80 is less sensitive to PVT variations. Circuit 80 also is capable of wide power supply voltage operation.

A comparison between circuit 80 and two of the three prior art designs with respect to hysteresis, delay and power consumption is given below in Table I:

TABLE I

|  | Prior art 2 | Prior art 3 | New design |
| --- | --- | --- | --- |
| Hysteresis | 750 mV | 100 mV | 750 mV |
| Switching Delay | 1.17 n | 1.07 n | 1.05 n |
| Average current | 3 uA | 2.9 uA | 2.7 uA |
| Area reduction | 0 | 9% | 82.6% |

It should be noted that the increased hysteresis of circuit 80 does not come at the cost of increased delay or current consumption An area comparison between circuit 80 and two of the three prior art designs is given below in Table II:

TABLE II

|  | Prior art 2 | Prior art 3 | New design |
| --- | --- | --- | --- |
| Inv1 P1 | 20 u/150 n | 20 u/150 n | 320 n/150 n |
| Inv1 N1 | 160 n/150 n | 160 n/150 n | 160 n/150 n |
| Inv2 P2 | 320 n/150 n | 320 n/150 n | 320 n/150 n |
| Inv2 N2 | 10 u/150 n | 10 u/150 n | 160 n/150 n |
| Inv3 P3 | 320 n/150 n | 320 n/150 n | 320 n/150 n |
| Inv3 N3 | 160 n/150 n | 160 n/150 n | 160 n/150 n |
| Inv4 P4 | 320 n/150 n | 320 n/150 n | 320 n/150 n |
| Inv4 N4 | 160 n/150 n | 160 n/150 n | 160 n/150 n |
| Inv5 P5(Weak) | 320 n/1 u |  | 320 n/1 u |
| Inv5 N5(Weak) | 160 n/1 u |  | 160 n/1 u |
| Inv6 P6 | 320 n/150 n | 320 n/150 n | 320 n/150 n |
| Inv6 N6 | 160 n/150 n | 160 n/150 n | 160 n/150 n |
| MOS PF |  |  | 160 n/150 n |
| MOS NF |  |  | 160 n/310 n |
| Total channel Area (WL | 5.2680E−12 | 4.7880E−12 | 9.1360E−1 |
| Percentage saving with respect to prior art2 | 0 | 9.1% | 82.65% |

Figure 12:
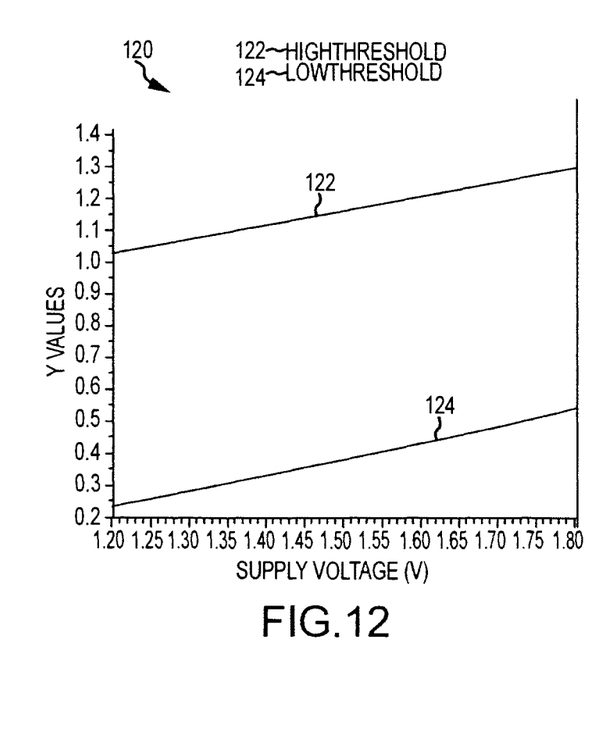
Figure 13:
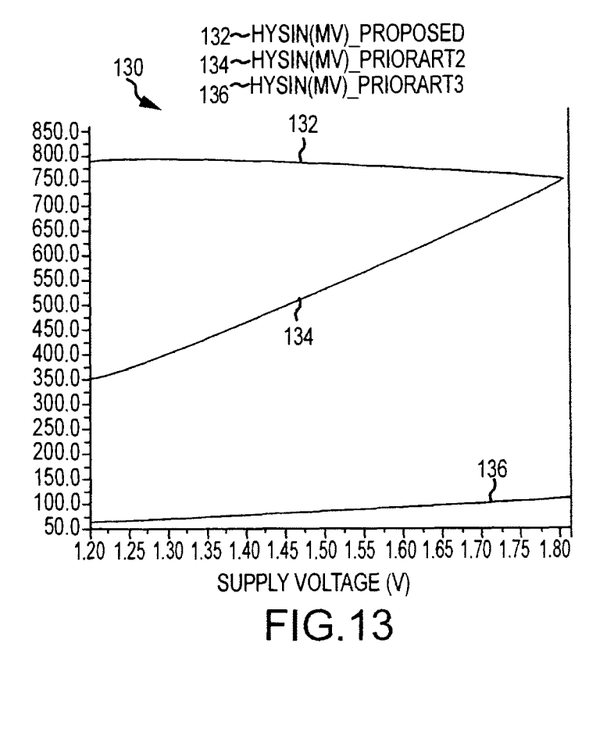

The effect of power supply voltage variation on hysteresis is shown in FIGS. 12 and 13. In FIG. 12, the high threshold 122 and low threshold 124 are shown. Note that there is a linear shift of the high and low thresholds with respect to power supply voltage. In FIG. 13, the hysteresis 132 of the present invention and the hysteresis 134, 136 is shown. Note that the hysteresis 132 of the present invention is significantly higher than the prior art, and yet constant with respect to power supply voltage.

Although an embodiment of the present invention has been described for purposes of illustration, it should be understood that various changes, modification and substitutions may be incorporated in the embodiment without departing from the spirit of the invention that is defined in the claims, which follow.

I claim:

1. A Schmitt trigger circuit comprising:
an input terminal;
an output terminal;
a first inverter having an input coupled to the input terminal;
a second inverter having an input coupled to the input terminal;
a first transistor directly coupled between VDD and the output of the first inverter, and a gate directly coupled to the output terminal;
a second transistor directly coupled between the output of the second inverter and ground, and a gate directly coupled to the output terminal;

a third transistor having a gate coupled to the output of the first inverter; and a fourth transistor having a gate coupled to the output of the second inverter, wherein a current path of the third and fourth transistors are coupled together to form the output terminal.

2. The Schmitt trigger circuit of claim 1 wherein a source of the first transistor is directly coupled to VDD.

3. The Schmitt trigger circuit of claim 1 wherein the first transistor comprises a P-channel transistor.

4. The Schmitt trigger circuit of claim 1 wherein a source of the second transistor is directly coupled to ground.

5. The Schmitt trigger circuit of claim 1 wherein the second transistor comprises an N-channel transistor.

6. The Schmitt trigger circuit of claim 1 wherein a source of the third transistor is coupled to VDD.

7. The Schmitt trigger circuit of claim 1 wherein the third transistor comprises a P-channel transistor.

8. The Schmitt trigger circuit of claim 1 wherein a source of the fourth transistor is coupled to ground.

9. The Schmitt trigger circuit of claim 1 wherein the fourth transistor comprises an N-channel transistor.

10. The Schmitt trigger circuit of claim 1 further comprises an inverter circuit having an input coupled to the output terminal, and an output.

11. The Schmitt trigger circuit of claim 10 wherein the inverter circuit comprises:

a third inverter having an input coupled to the input terminal of the inverter circuit;

a fourth inverter having an output coupled to the input terminal of the inverter circuit; and a fifth inverter having an input coupled to an output of the third inverter and to an input of the fourth inverter, and an output forming the output of the inverter circuit.

12. The Schmitt trigger circuit of claim 1 wherein the first and second inverters have the same size.

13. The Schmitt trigger circuit of claim 1 wherein the first and second inverters have a minimum size.

14. A Schmitt trigger circuit comprising:

a first inverter having an input coupled to an input terminal;

a second inverter having an input coupled to the input terminal;

a first transistor having a source coupled to VDD, a drain directly coupled to an output of the first inverter, and a gate directly coupled to an output terminal;

a second transistor having a source directly coupled to ground, a drain directly coupled to an output of the second inverter, and a gate coupled to the output terminal;

a third transistor having a source coupled to VDD, a drain directly coupled to the output terminal, and a gate coupled to the output of the first inverter; and a fourth transistor having a source coupled to ground, a drain coupled to the output terminal, and a gate coupled to the output of the second inverter.

15. A Schmitt trigger circuit comprising:

a first inverter having an input coupled to an input terminal;

a second inverter having an input coupled to the input terminal;

a first transistor having a source directly coupled to VDD, a drain directly coupled to an output of the first inverter, and a gate coupled to an output terminal;

a second transistor having a source directly coupled to ground, a drain directly coupled to an output of the second inverter, and a gate directly coupled to the output terminal;

a third transistor having a source coupled to VDD, a drain directly coupled to the output terminal, and a gate coupled to the output of the first inverter; and a fourth transistor having a source coupled to ground, a drain coupled to the output terminal, and a gate coupled to the output of the second inverter.

* * * * *